(12) United States Patent
Tsai et al.

(10) Patent No.: US 12,362,186 B2
(45) Date of Patent: Jul. 15, 2025

(54) PIP STRUCTURE AND MANUFACTURING METHODS OF HIGH VOLTAGE DEVICE AND CAPACITOR DEVICE HAVING PIP STRUCTURE

(71) Applicant: Richtek Technology Corporation, Zhubei (TW)

(72) Inventors: Chin-Chin Tsai, Tainan (TW); Yong-Zhong Hu, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 514 days.

(21) Appl. No.: 17/933,126

(22) Filed: Sep. 19, 2022

(65) Prior Publication Data

US 2023/0238242 A1 Jul. 27, 2023

Related U.S. Application Data

(60) Provisional application No. 63/302,911, filed on Jan. 25, 2022.

(30) Foreign Application Priority Data

Jun. 30, 2022 (TW) .................................. 111124579

(51) Int. Cl.
| | |
|---|---|
| *H01L 21/28* | (2025.01) |
| *H01L 21/768* | (2006.01) |
| *H10D 1/00* | (2025.01) |
| *H10D 1/68* | (2025.01) |
| *H10D 30/01* | (2025.01) |

(Continued)

(52) U.S. Cl.
CPC .. *H01L 21/28229* (2013.01); *H01L 21/76897* (2013.01); *H10D 1/043* (2025.01); *H10D 1/714* (2025.01); *H10D 30/0221* (2025.01); *H10D 30/603* (2025.01); *H10D 64/111* (2025.01); *H10D 64/661* (2025.01); *H10D 84/811* (2025.01)

(58) Field of Classification Search
CPC .............. H01L 21/28229; H10D 1/043; H10D 84/811; H10D 84/0142; H10D 64/661; H10D 64/112; H10D 30/0221; H10D 30/603; H10D 30/023; H10D 30/6215; H10D 30/6733; H10D 62/111
See application file for complete search history.

(56) References Cited

U.S. PATENT DOCUMENTS

| | | | |
|---|---|---|---|
| 9,698,260 B1* | 7/2017 | Zhang | ............... H10D 30/0285 |
| 2006/0065928 A1* | 3/2006 | Nagai | ............... H10D 30/0227 |
| | | | 257/E29.264 |

(Continued)

*Primary Examiner* — Jose R Diaz
(74) *Attorney, Agent, or Firm* — Tung & Associates

(57) ABSTRACT

A polysilicon-insulator-polysilicon (PIP) structure includes: a first polysilicon region formed on a substrate; a first insulation region formed outside one side of the first polysilicon region and adjoined to the first polysilicon region in a horizontal direction; and a second polysilicon region formed outside one side of the first insulation region. The first polysilicon region, the first insulation region and the second polysilicon region are adjoined in sequence in the horizontal direction. The second polysilicon region is formed outside the first insulation region by a first self-aligned process step, and the first insulation region is formed outside the first polysilicon region by a second self-aligned process step.

13 Claims, 17 Drawing Sheets

(51) Int. Cl.
  *H10D 30/60* (2025.01)
  *H10D 64/00* (2025.01)
  *H10D 64/66* (2025.01)
  *H10D 84/80* (2025.01)

(56) References Cited

U.S. PATENT DOCUMENTS

2015/0340448 A1* 11/2015 Babcock ............... H10D 62/83
                                                              257/340
2023/0402327 A1* 12/2023 Tsai ................... H10D 84/0142

\* cited by examiner

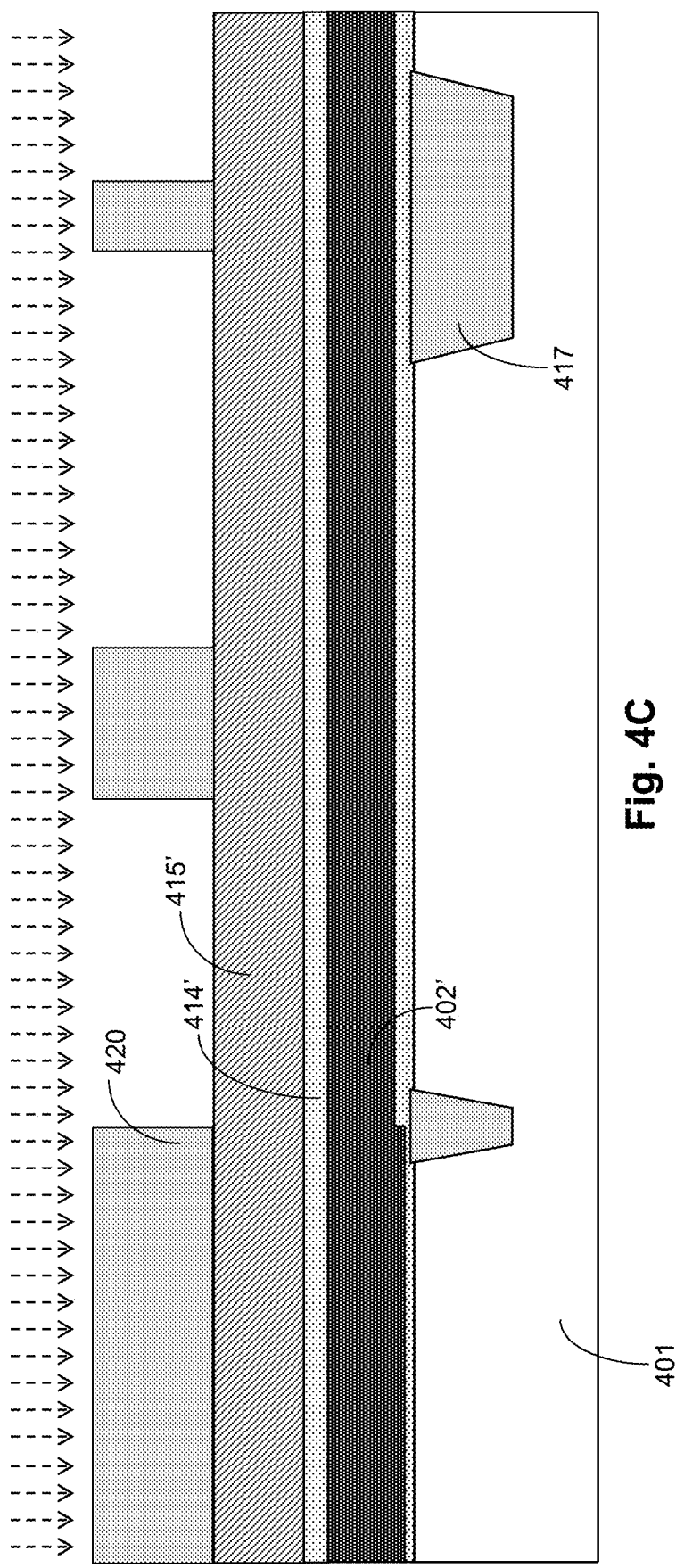

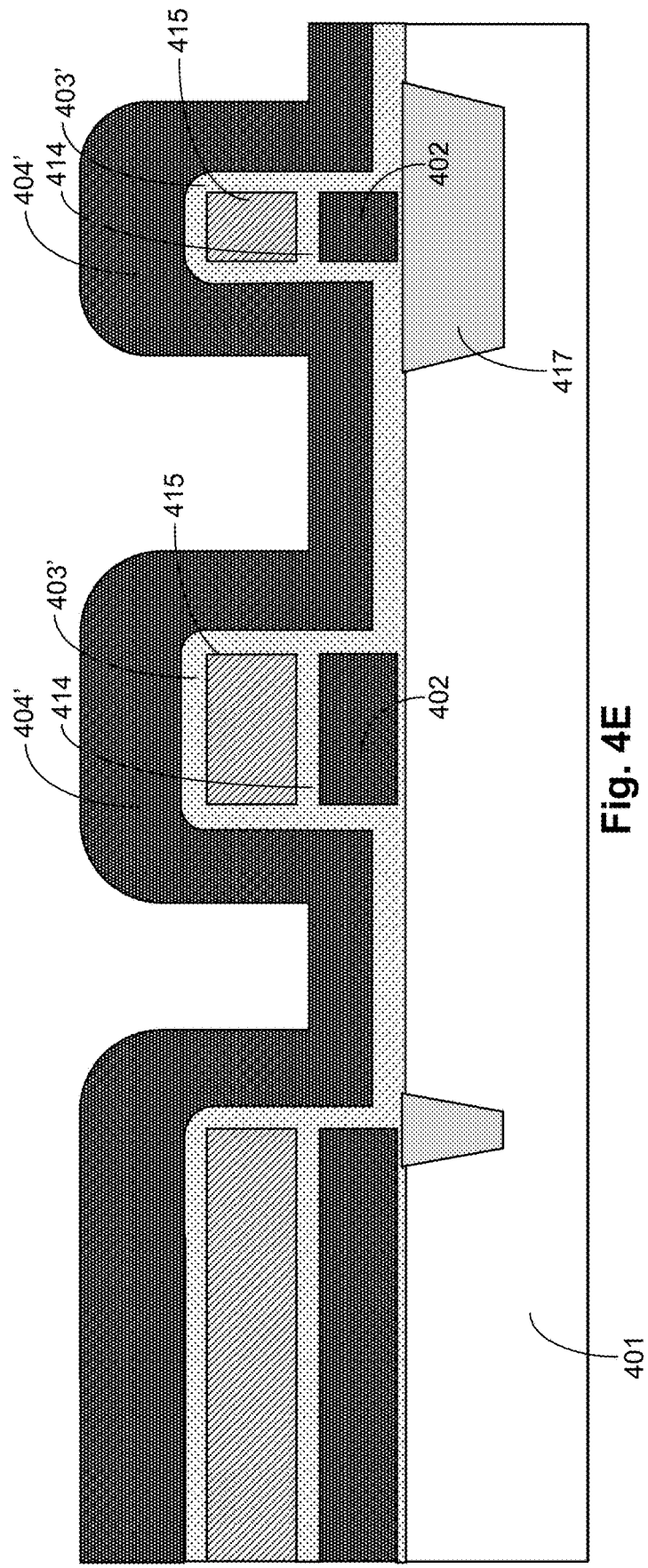

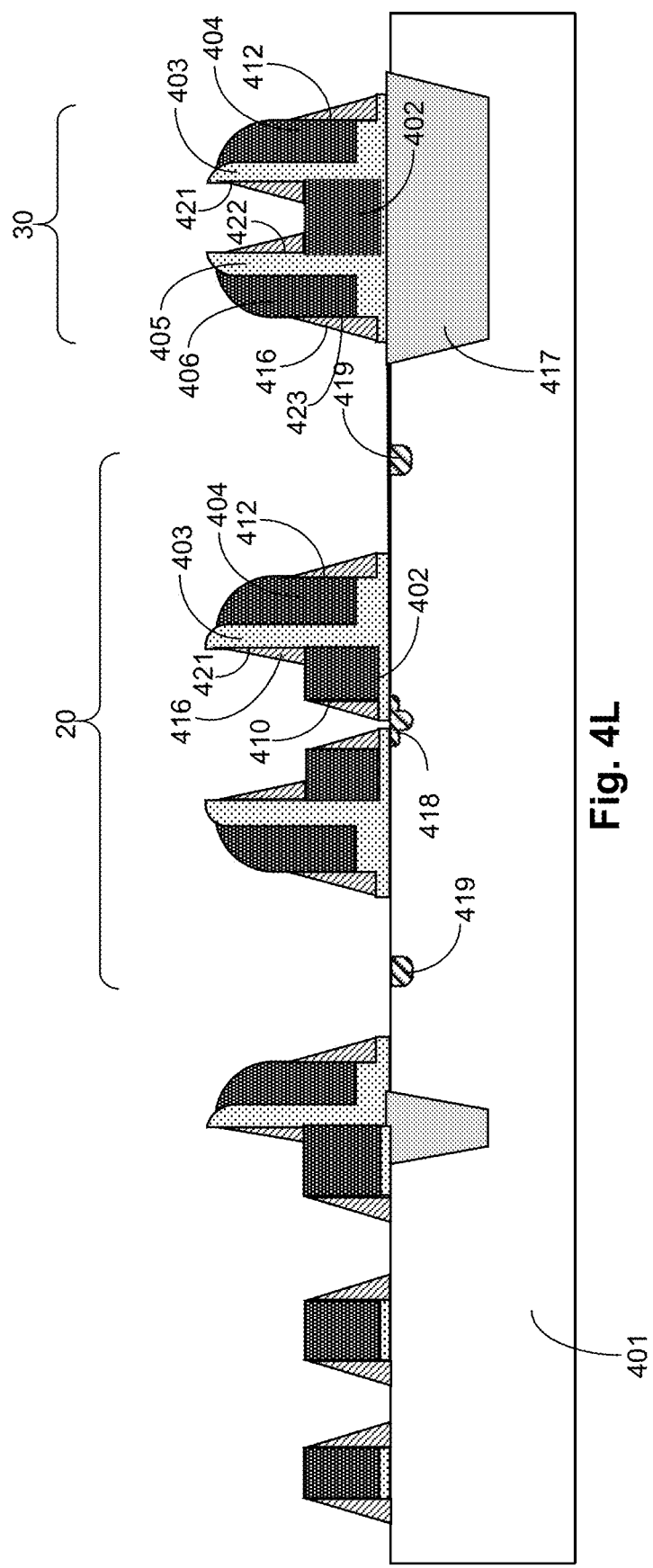

PIP STRUCTURE AND MANUFACTURING METHODS OF HIGH VOLTAGE DEVICE AND CAPACITOR DEVICE HAVING PIP STRUCTURE

CROSS REFERENCE

The present invention claims priority to provisional applications, Ser. No. 63/302,911, filed on Jan. 25, 2022, and TW 111124579, filed on Jun. 30, 2022.

BACKGROUND OF THE INVENTION

Field of Invention

The present invention relates to a polysilicon-insulator-polysilicon (PIP) structure, a manufacturing method of a high voltage device with a capacitor device having PIP structure, and a manufacturing method of a capacitor device having PIP structure; particularly, it relates to a PIP structure which can shorten the distance between a gate and a split gate, and manufacturing methods of a high voltage device and a capacitor device which have such PIP structure.

Description of Related Art

Please refer to FIG. 1. FIG. 1 shows a schematic diagram of a cross-section view of a conventional high voltage device. As shown in FIG. 1, to minimize the size of a conventional high voltage device 10, it will be subject to the following limitations: the thickness of the spacer layer 116 between the gate G1 and the split gate G2, the thickness of the self-aligned oxide layer 108, and the thickness of the reduced-surface-field (RESURF) oxide layer 104. Another drawback of this conventional high voltage device 10 is that the split gate G2 will drift and deform because of the stack of the spacer layer 116 between the gate G1 and the split gate G2, the self-aligned oxide layer 108 and the RESURF oxide layer 104. To explain this in another way, because the thickness of the RESURF oxide layer 104 is thick, the distance between the gate G1 and the split gate G2 is prolonged; however if the distance between the split gate G2 and the gate G1 is shortened to reduce the size, this will squeeze the RESURF oxide layer 104 to cause tilt of the split gate G2, making the manufacturing process control very difficult.

In view of the above, to overcome the drawbacks in the prior art, the present invention proposes a new PIP structure and manufacturing methods of a high voltage device and a capacitor device which have such PIP structure.

SUMMARY OF THE INVENTION

From one perspective, the present invention provides a polysilicon-insulator-polysilicon (PIP) structure comprising: a first polysilicon region which is formed on a substrate; a first insulation region which is formed outside a first side of the first polysilicon region and adjoined to the first polysilicon region in a horizontal direction, wherein the first side and a second side are opposite sides of the first polysilicon region; and a second polysilicon region which is formed outside a third side of the first insulation region, such that the first polysilicon region, the first insulation region and the second polysilicon region are adjoined in sequence in the horizontal direction; wherein the second polysilicon region is formed outside the third side of the first insulation region by a first self-aligned process step; wherein the first insulation region is formed outside the first side of the first polysilicon region by a second self-aligned process step.

In one preferred embodiment, the PIP structure is applied to a high voltage device, wherein the high voltage device having the PIP structure includes: a source which is formed in the substrate below and outside the second side of the first polysilicon region; and a drain which is formed in the substrate below and outside a fourth side of the second polysilicon region, wherein the fourth side is an opposite side of the second polysilicon region which is opposite to a side of the second polysilicon region that is adjoined to the third side of the first insulation region; wherein the first polysilicon region is configured to form a gate of the high voltage device to control ON and OFF states of the high voltage device; wherein the second polysilicon region is configured to form a split gate of the high voltage device to adjust an electric field of a drift region during an operation of the high voltage device.

In one preferred embodiment, the PIP structure serves as a capacitor device, wherein the first polysilicon region is configured to form a first electrode of the capacitor device, and the first insulation region is configured to form a dielectric layer of the capacitor device, and the second polysilicon region is configured to form a second electrode of the capacitor device.

In one preferred embodiment, the capacitor device further includes: a second insulation region which is formed outside the second side of the first polysilicon region and is adjoined to the first polysilicon region in the horizontal direction; and a third polysilicon region which is formed outside a fifth side of the second insulation region, such that the first polysilicon region, the second insulation region and the third polysilicon region are adjoined in sequence in a reverse direction of the horizontal direction; wherein the third polysilicon region is formed outside the fifth side of the second insulation region by the first self-aligned process step; wherein the second insulation region is formed outside the second side of the first polysilicon region by the second self-aligned process step.

In one preferred embodiment, a thickness of a gate oxide layer of the gate is between 80 Å and 130 Å.

In one preferred embodiment, the high voltage device further includes: a metal silicide region which is formed outside the fourth side of the second polysilicon region, and is configured to serve as an electrical contact of the second polysilicon region; and a third insulation region which is formed outside the second polysilicon region by a third self-aligned process step; wherein the third insulation region is configured to define a drain-extended region of the high voltage device, wherein a length of the drain-extended region in the horizontal direction is between 200 Å and 300 Å.

From another perspective, the present invention provides a manufacturing method of a high voltage device having PIP structure, comprising: forming a first polysilicon layer on a substrate; forming a sacrificial layer on the first polysilicon layer; forming a height determining layer on the sacrificial layer; etching the first polysilicon layer, the sacrificial layer and the height determining layer by a first patterning process step to form a first stack region, wherein the first stack region includes a first polysilicon region, a sacrificial region and a height determining region; forming a first insulation layer covering the first stack region; forming a second polysilicon layer covering the first insulation layer; forming a second polysilicon region outside the first insulation layer by a first self-aligned process step; forming a first insulation region outside a first side of the first polysilicon region by a second self-aligned process step; removing the height determining region to form a PIP structure; etching the sacrificial region and the first polysilicon region of the PIP structure by a second patterning process step, to form a dual gate structure; forming a source in the substrate below and outside a second side of the first polysilicon region, wherein the first side and the second side are opposite sides of the first polysilicon region; and forming a drain in the substrate below and outside a fourth side of the second polysilicon region, wherein the fourth side is an opposite side of the second polysilicon region which is opposite to a side of the second polysilicon region that is adjoined to the third side of the first insulation region; wherein the first polysilicon region is configured to form a gate of the high voltage device to control ON and OFF states of the high voltage device; wherein the second polysilicon region is configured to form a split gate of the high voltage device to adjust an electric field of a drift region during an operation of the high voltage device; wherein the first polysilicon region, the first insulation region and the second polysilicon region of the dual gate structure are adjoined in sequence in a horizontal direction.

In one preferred embodiment, a height of the second polysilicon region is 1.5 times to 2 times of a height of the first polysilicon region.

In one preferred embodiment, the manufacturing method of the high voltage device having PIP structure further comprising: forming a metal silicide region outside the fourth side of the second polysilicon region, the metal silicide region being configured to serve as an electrical contact of the second polysilicon region; and forming a third insulation region outside the second polysilicon region by a third self-aligned process step; wherein the third insulation region is configured to define a drain-extended region of the high voltage device, wherein a length of the drain-extended region in the horizontal direction is between 200 Å and 300 Å.

In one preferred embodiment, the split gate is electrically connected to the gate or a ground.

From another perspective, the present invention provides a manufacturing method of a capacitor device having PIP structure, comprising: forming a first polysilicon layer on a substrate; forming a sacrificial layer on the first polysilicon layer; forming a height determining layer on the sacrificial layer; etching the first polysilicon layer, the sacrificial layer and the height determining layer by a first patterning process step to form a first stack region, wherein the first stack region includes a first polysilicon region, a sacrificial region and a height determining region; forming a first insulation layer covering the first stack region; forming a second polysilicon layer covering the first insulation layer; forming a second polysilicon region outside the first insulation layer by a first self-aligned process step; forming a first insulation region outside a first side of the first polysilicon region by a second self-aligned process step; and removing the height determining region to form a PIP structure; wherein the first polysilicon region is configured to form a first electrode of the capacitor device, and the first insulation region is configured to form a dielectric layer of the capacitor device, and the second polysilicon region is configured to form a second electrode of the capacitor device.

In one preferred embodiment, the manufacturing method further comprises: forming a second insulation region outside a second side of the first polysilicon region and adjoined to the first polysilicon region in a horizontal direction; and forming a third polysilicon region outside a fifth side of the second insulation region, such that the first polysilicon region, the second insulation region and the third polysilicon region are adjoined in sequence in a reverse direction of the horizontal direction; wherein the third polysilicon region is formed outside the fifth side of the second insulation region by the first self-aligned process step; wherein the second insulation region is formed outside the second side of the first polysilicon region by the second self-aligned process step.

In one preferred embodiment, a height of the second electrode is 1.5 times to 2 times of a height of the first electrode.

In one preferred embodiment, the first insulation region is formed by a high temperature oxidation (HTO) process step or a rapid thermal oxidation (RTO) process step.

In one preferred embodiment, the first insulation region includes tetraethoxysilane (TEOS).

In one preferred embodiment, a thickness of the first insulation region in the horizontal direction is between 400 Å and 900 Å.

Advantages of the present invention include: by forming a high voltage device with a capacitor device having PIP structure, the split gate does not deform or drift by the stack of multiple layers of the insulation region or the spacer layer, and the distance between the gate and the split gate is only related to the thickness of the first insulation region in the horizontal direction.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, while the shapes, thicknesses, and widths are not drawn in actual scale.

Figure 1:
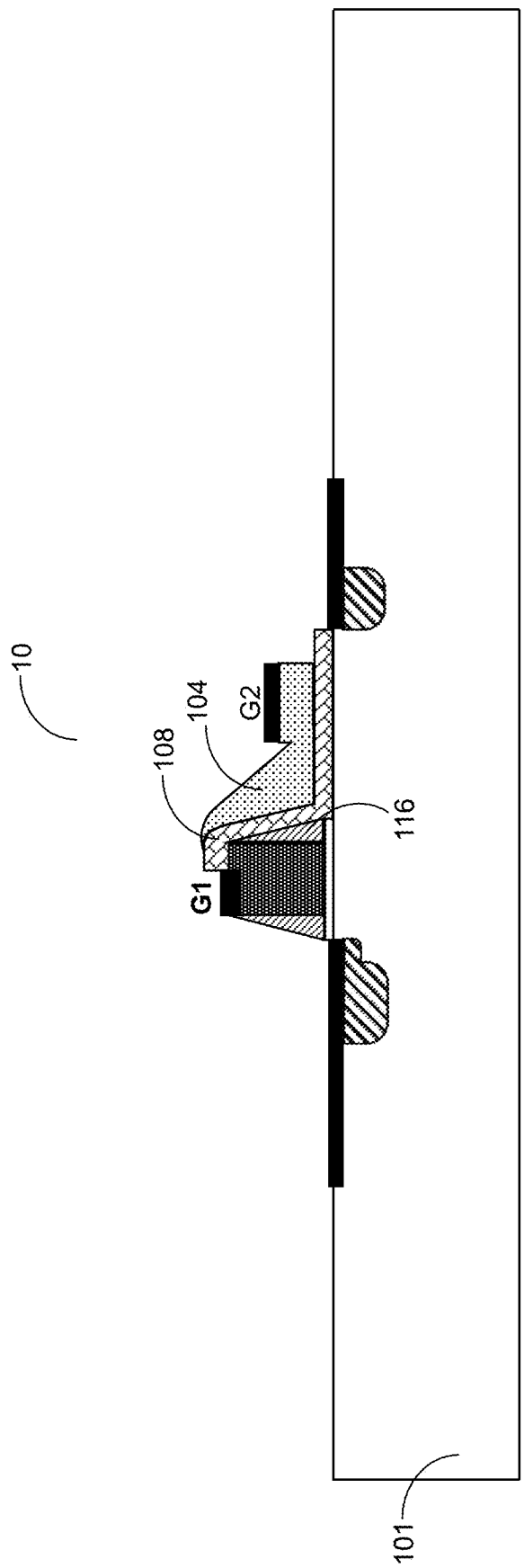
FIG. 1 shows a schematic diagram of a cross-section view of a conventional high voltage device.
Figure 2:
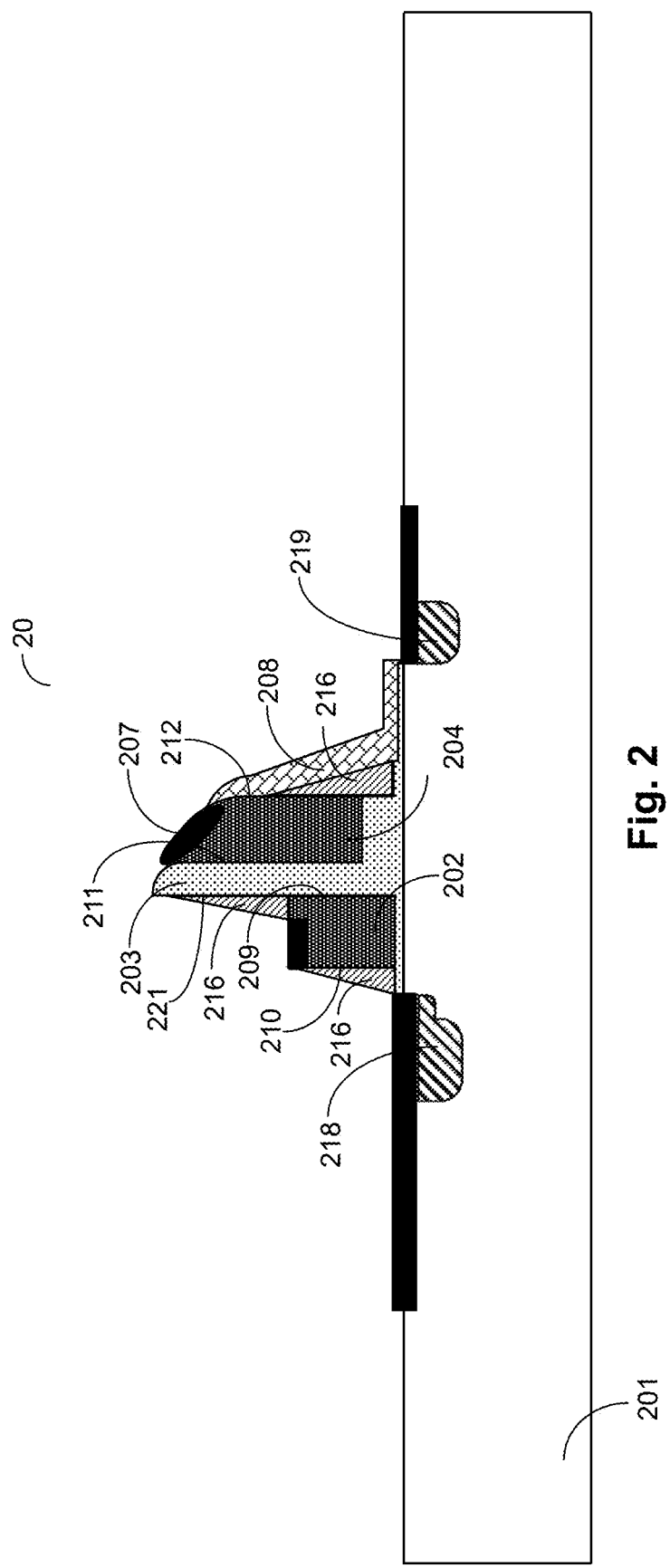
FIG. 2 shows a schematic diagram of a cross-section view of a high voltage device having PIP structure according to an embodiment of the present invention.

Please refer to FIG. 2, which shows a schematic diagram of a cross-section view of a high voltage device having polysilicon-insulator-polysilicon (PIP) structure according to an embodiment of the present invention. As shown in FIG. 2, a high voltage device 20 having PIP structure according to the present invention comprises: a first polysilicon region 202, a first insulation region 203, a second polysilicon region 204, a metal silicide region 207, a third insulation region 208, a source 218 and a drain 219. The first polysilicon region 202 is formed on a substrate 201. The substrate 201 is, for example but not limited to, a P conductivity type or an N conductivity type semiconductor substrate. The substrate 201 can be formed by any method known to a person having ordinary skill in the art, so the details thereof are not redundantly explained here. The first insulation region 203 is formed outside a first side 209 of the first polysilicon region 202 and adjoined to the first polysilicon region 202 in a horizontal direction. The first polysilicon region 202 has the first side 209 and a second side 210 which are opposite sides to each other. The second polysilicon region 204 is formed outside a third side 211 of the first insulation region 203. The first polysilicon region 202, the first insulation region 203 and the second polysilicon region 204 are adjoined in sequence in the horizontal direction.

In one embodiment, the second polysilicon region 204 is formed outside the third side 211 of the first insulation region 203 by a first self-aligned process step. In one embodiment, the first insulation region 203 is formed outside the first side 209 of the first polysilicon region 202 by a second self-aligned process step. The metal silicide region 207 is formed outside a fourth side 212 of the second polysilicon region 204, configured to serve as an electrical contact of the second polysilicon region 204. The third insulation region 208 is formed outside the second polysilicon region 204 by a third self-aligned process step. The third insulation region 208 is configured to define a drain-extended region of the high voltage device 20. In one embodiment, a length of the drain-extended region in the horizontal direction is between 200 Å and 300 Å. The source 218 is formed in the substrate 201 below and outside the second side 210 of the first polysilicon region 202. The first side 209 and the second side 210 are opposite sides of the first polysilicon region 202. The drain 219 is formed in the substrate 201 below and outside the fourth side 212 of the second polysilicon region 204. The fourth side 212 is an opposite side of the second polysilicon region 204 which is opposite to the third side 211 of the first insulation region 203 (i.e., the fourth side 212 is an opposite side which is opposite to a side of the second polysilicon region 204 that is adjoined to the third side 211 of the first insulation region 203). The first polysilicon region 202 is configured to form a gate of the high voltage device 20 to control ON and OFF states of the high voltage device 20. The second polysilicon region 204 is configured to form a split gate of the high voltage device 20 to adjust an electric field of a drift region during an operation of the high voltage device 20. A spacer layer 216 is formed and connected outside a sixth side 221 of the first insulation region 203, outside the fourth side 212 of the second polysilicon region 204 and outside the second side 210 of the first polysilicon region 202.

In one embodiment, a height of the second polysilicon region 204 is 1.5 times to 2 times of a height of the first polysilicon region 202. In one embodiment, the first insulation region 203 is formed by a high temperature oxidation (HTO) process step or a rapid thermal oxidation (RTO) process step. In one embodiment, the first insulation region 203 is formed by a material including tetraethoxysilane (TEOS). In one embodiment, a thickness of the first insulation region 203 in the horizontal direction is between 400 Å and 900 Å. In one embodiment, a thickness of a gate oxide layer of the gate (e.g. the first insulation region 203 vertically below the first polysilicon region 202) is between 80 Å and 130 Å. The split gate (e.g. the second polysilicon region 204) is electrically connected to the gate (e.g. the first polysilicon region 202) or a ground.

Figure 3:
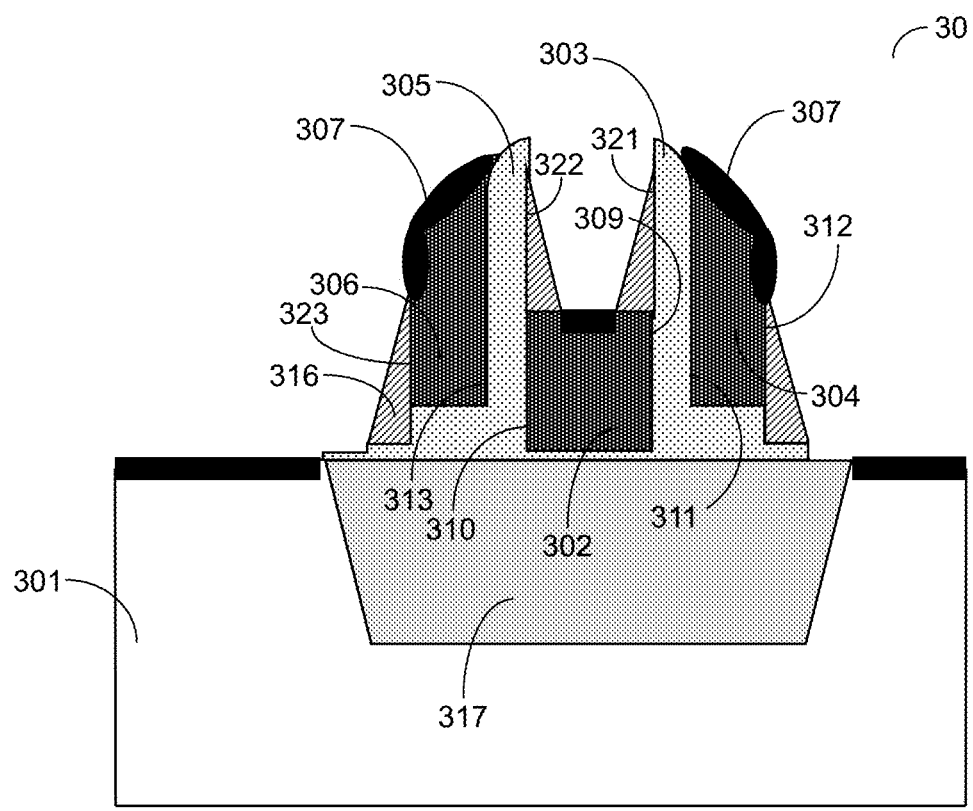
FIG. 3 shows a schematic diagram of a cross-section view of a capacitor device having PIP structure according to another embodiment of the present invention.

FIG. 3 shows a schematic diagram of a cross-section view of a capacitor device having PIP structure according to another embodiment of the present invention. As shown in FIG. 3, a capacitor device 30 having PIP structure according to the present invention includes: a first polysilicon region 302, a first insulation region 303, a second polysilicon region 304, a second insulation region 305, a third polysilicon region 306 and a metal silicide region 307. The first polysilicon region 302 is formed on a substrate 301. The first insulation region 303 is formed outside a first side 309 of the first polysilicon region 302 and adjoined to the first polysilicon region 302 in a horizontal direction. The second polysilicon region 304 is formed outside a third side 311 of the first insulation region 303, such that the first polysilicon region 302, the first insulation region 303 and the second polysilicon region 304 are adjoined in sequence in the horizontal direction. In one embodiment, the second polysilicon region 304 is formed outside the third side 311 of the first insulation region 303 by a first self-aligned process step. In one embodiment, the first insulation region 303 is formed outside the first side 309 of the first polysilicon region 302 by a second self-aligned process step.

The first polysilicon region 302 is configured to form a first electrode of the capacitor device 30, and the first insulation region 303 is configured to form a dielectric layer of the capacitor device 30, and the second polysilicon region 304 is configured to form a second electrode of the capacitor device 30. The second insulation region 305 is formed outside a second side 310 of the first polysilicon region 302 and adjoined to the first polysilicon region 302 in the horizontal direction. The third polysilicon region 306 is formed outside a fifth side 313 of the second insulation region 305, such that the first polysilicon region 302, the second insulation region 305 and the third polysilicon region 306 are adjoined in sequence in a reverse direction of the horizontal direction. In one embodiment, the third polysilicon region 306 is formed outside the fifth side 313 of the second insulation region 305 by the first self-aligned process step. In one embodiment, the second insulation region 305 is formed outside the second side 310 of the first polysilicon region 302 by the second self-aligned process step.

The metal silicide region 307 is formed outside a fourth side 312 of the second polysilicon region 304 and outside a eighth side 323 of the third polysilicon region 306, to serve as electrical contacts of the second polysilicon region 304 and the third polysilicon region 306, respectively. A spacer layer 316 is formed outside a sixth side 321 of the first insulation region 303, outside the fourth side 312 of the second polysilicon region 304, outside a seventh side 322 of the second insulation region 305 and outside the eighth side 323 of the third polysilicon region 306. In one preferred embodiment, the capacitor device 30 is formed on an insulation layer which is for example but not limited to a shallow trench isolation (STI) structure 317. In one embodiment, each of the height of the second polysilicon region 304 and the height of the third polysilicon region 306 is 1.5 times to 2 times of a height of the first polysilicon region 302. In one embodiment, the first insulation region 303 and the second insulation region 305 are formed by a high temperature oxidation (HTO) process step or a rapid thermal oxidation (RTO) process step. In one embodiment, the first insulation region 303 and the second insulation region 305 are formed by a material including tetraethoxysilane (TEOS).

In one embodiment, each of the thickness of the first insulation region 303 in the horizontal direction and the thickness of the second insulation region 305 in the horizontal direction is for example between 400 Å and 900 Å. In one embodiment, the capacitor device 30 can be separated into two capacitors by cutting in the middle of the first polysilicon region 302, wherein the two capacitors can be coupled in parallel to form one capacitor. In one embodiment, when the above mentioned two capacitors are coupled in parallel, the metal silicide region 307 of the second polysilicon region 304 can be electrically connected to the metal silicide region 307 of the third polysilicon region 306, and two parts of the first polysilicon region 302 which are separated to each other can be electrically connected together.

Figure 4A:
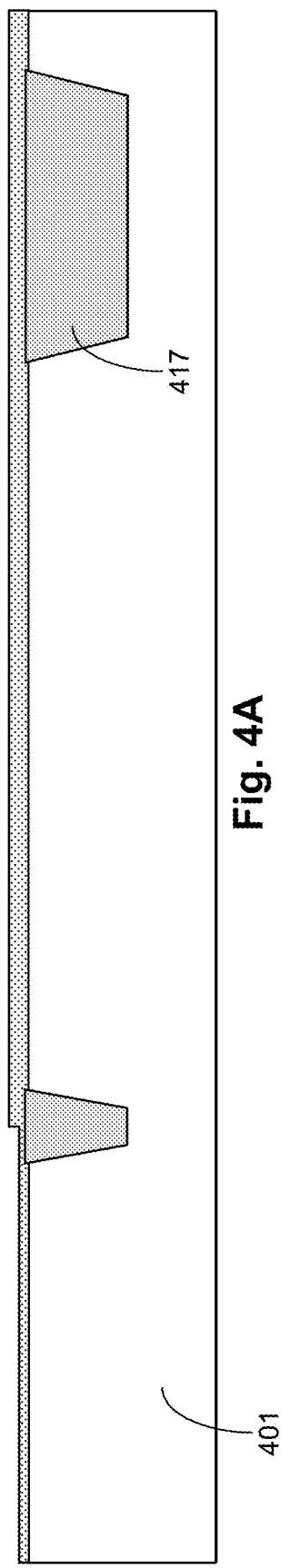
FIG. 4A to FIG. 4N show cross-section views of a manufacturing method for a high voltage device and a capacitor device having PIP structure according to embodiments of the present invention.
Figure 4B:
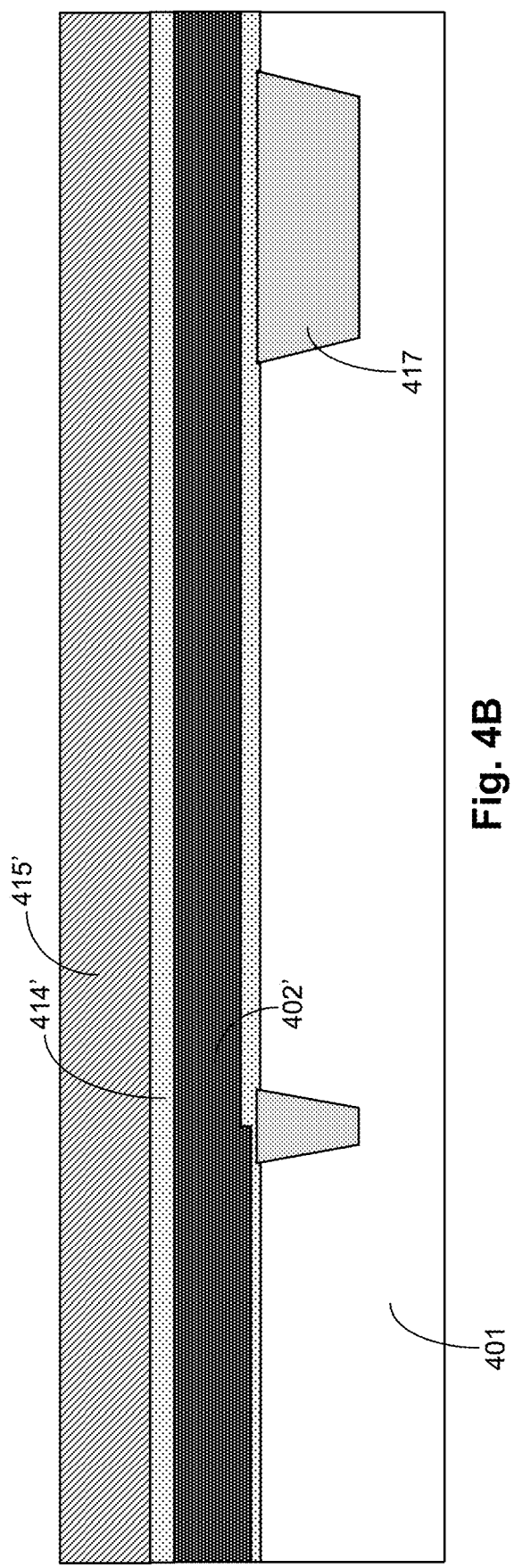
Figure 4D:
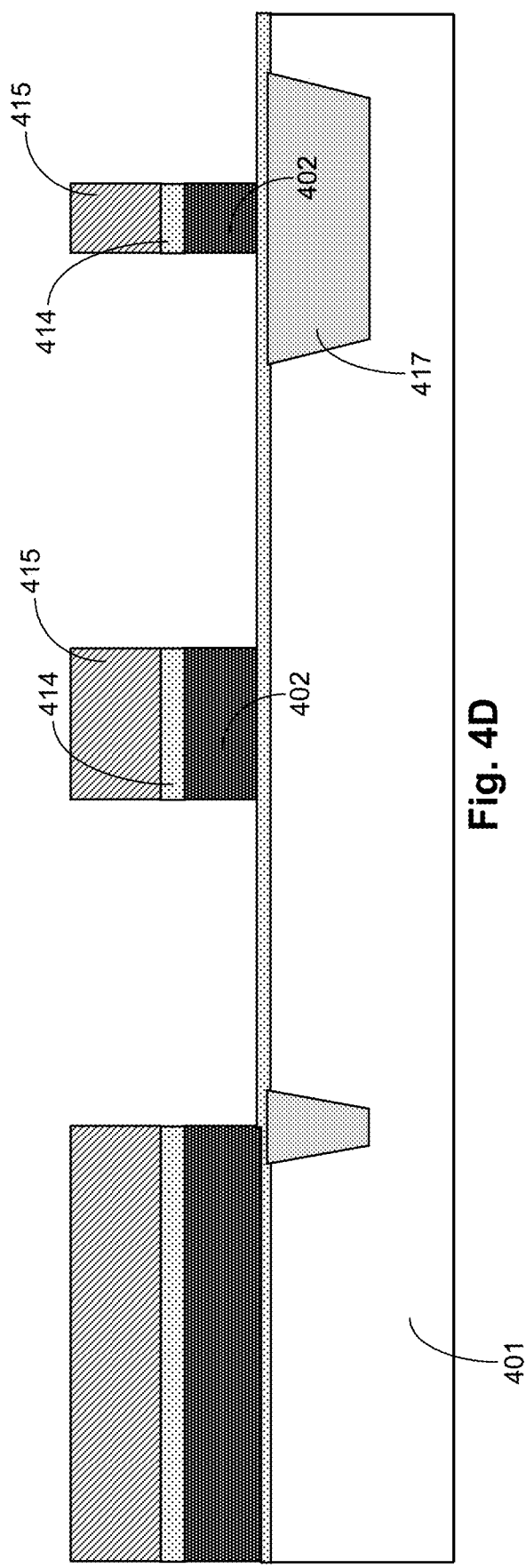
Figure 4F:
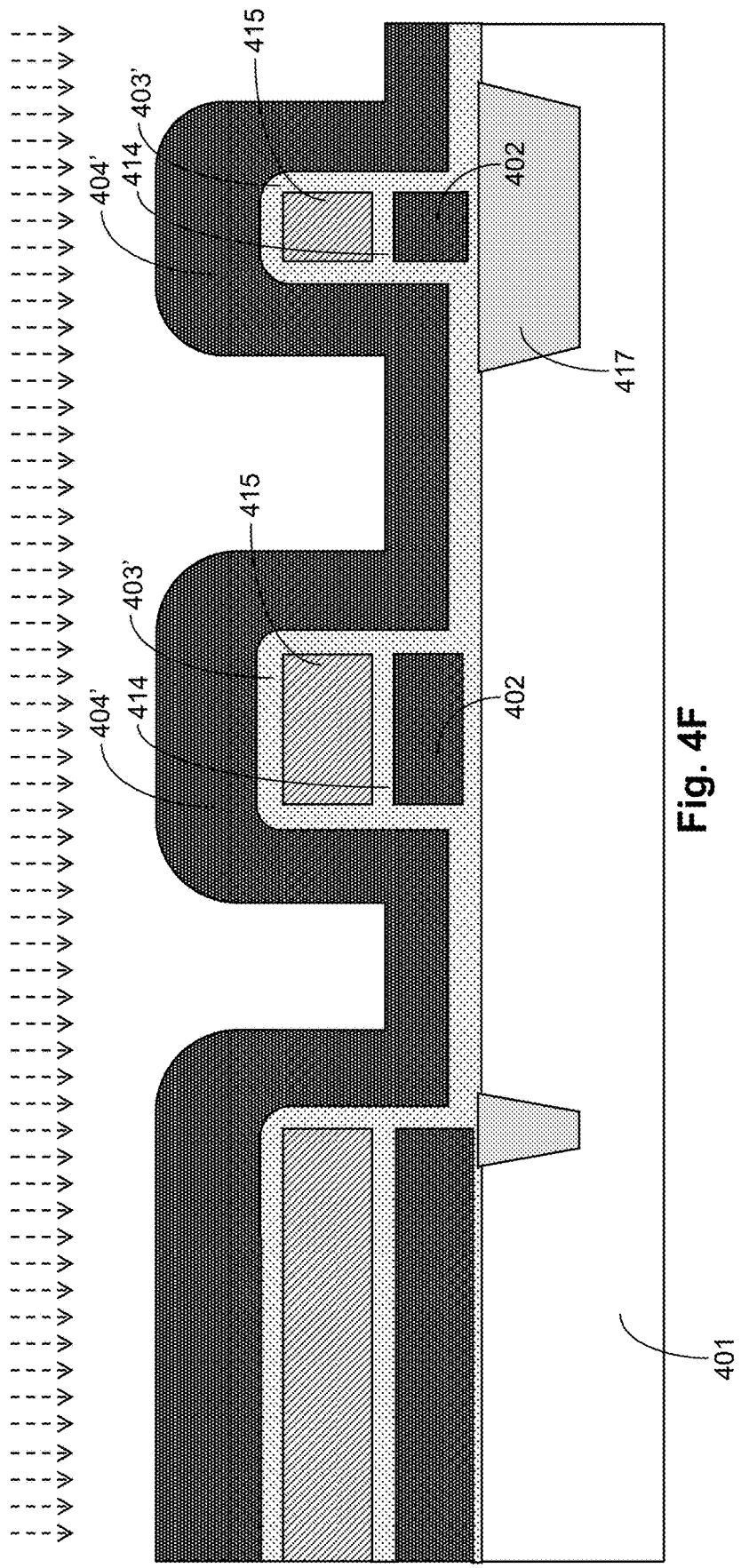
Figure 4G:
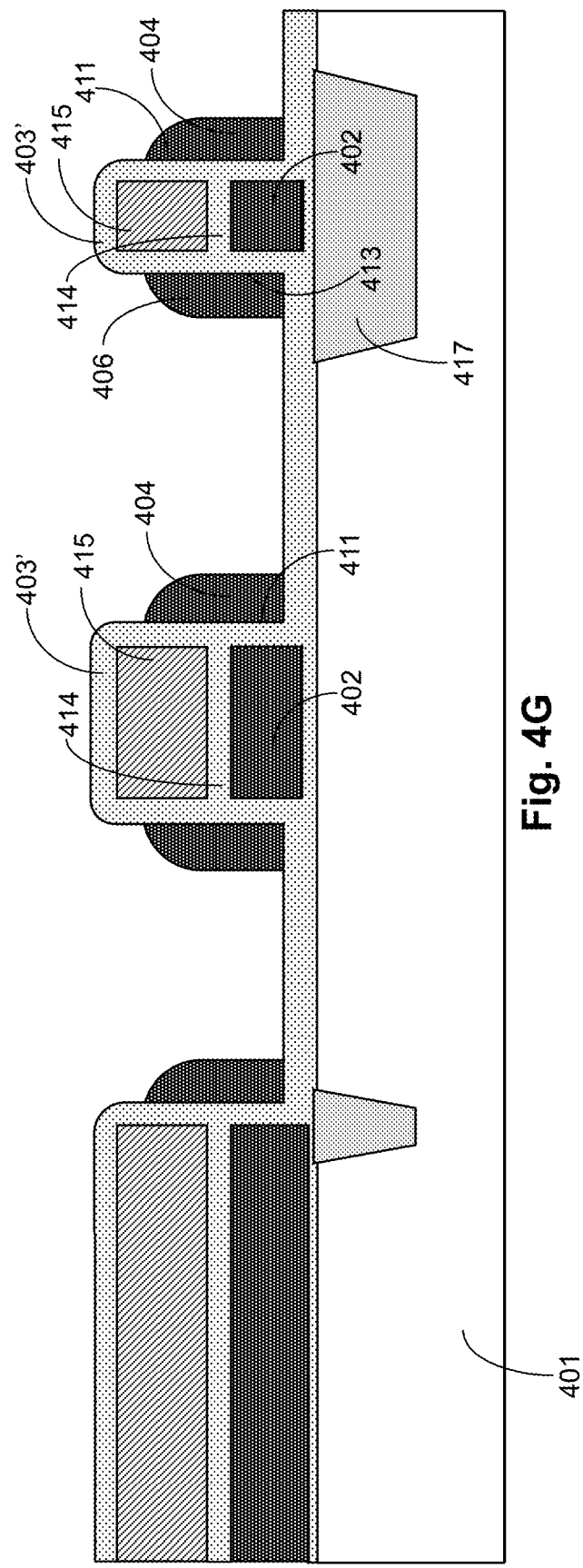
Figure 4H:
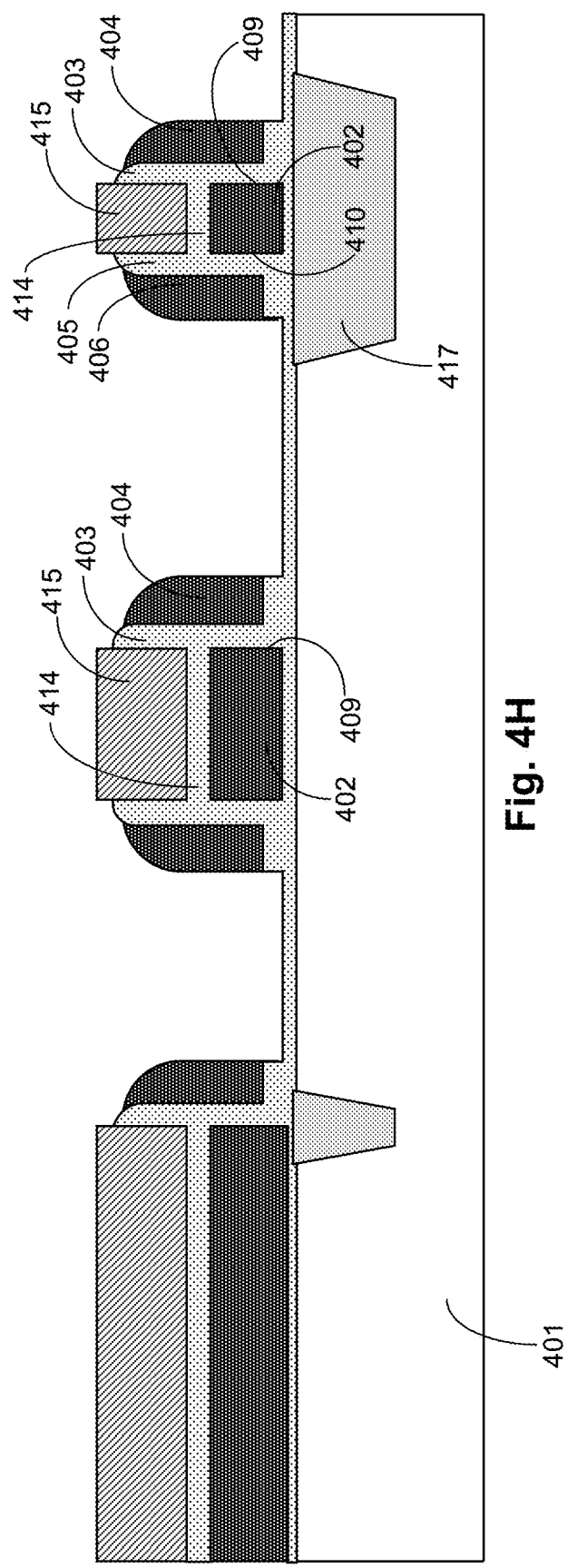
Figure 4I:
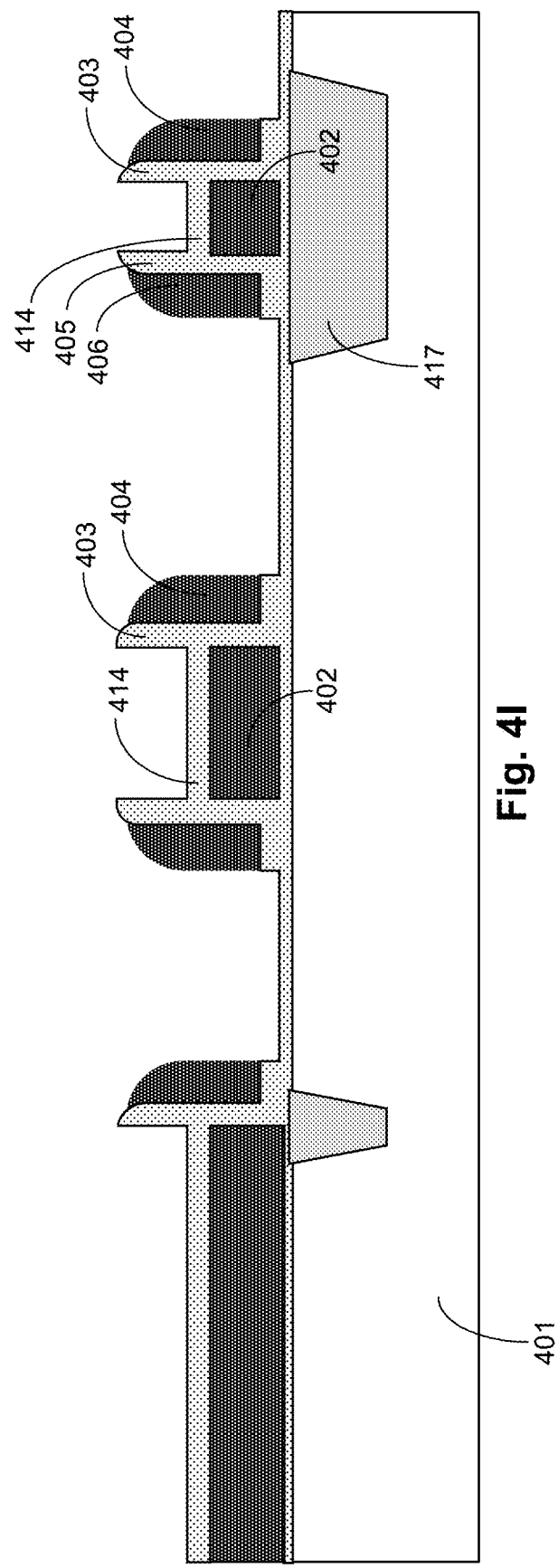
Figure 4J:
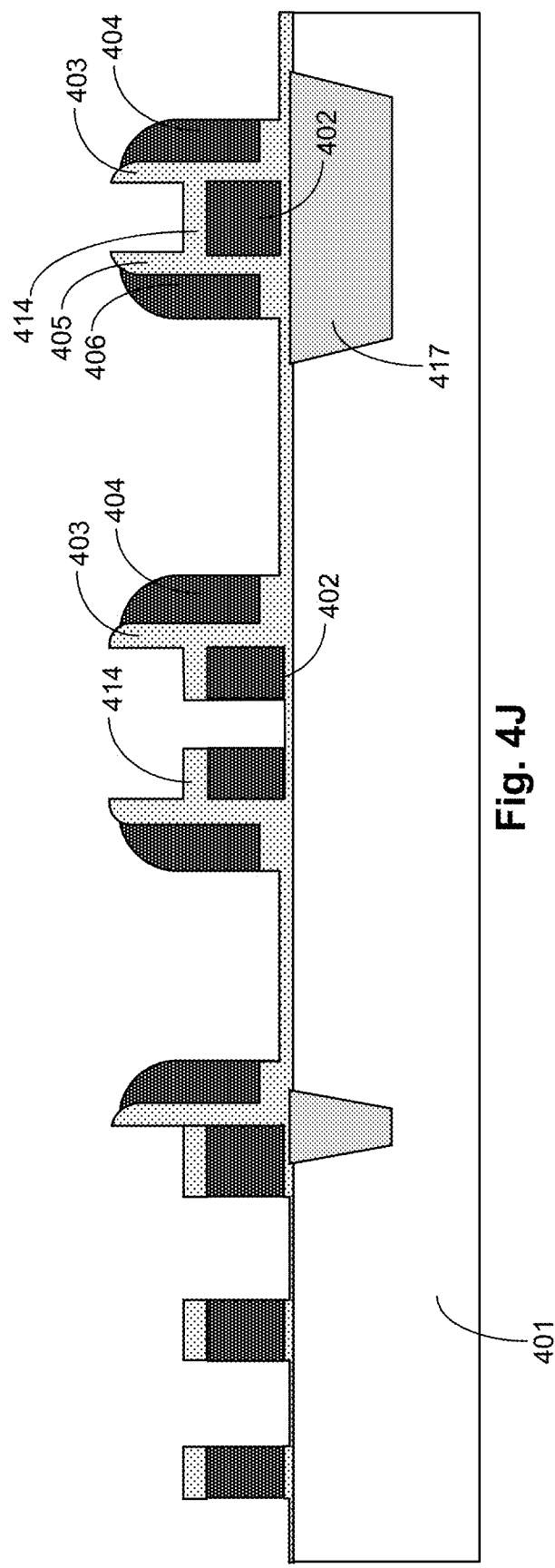
Figure 4K:
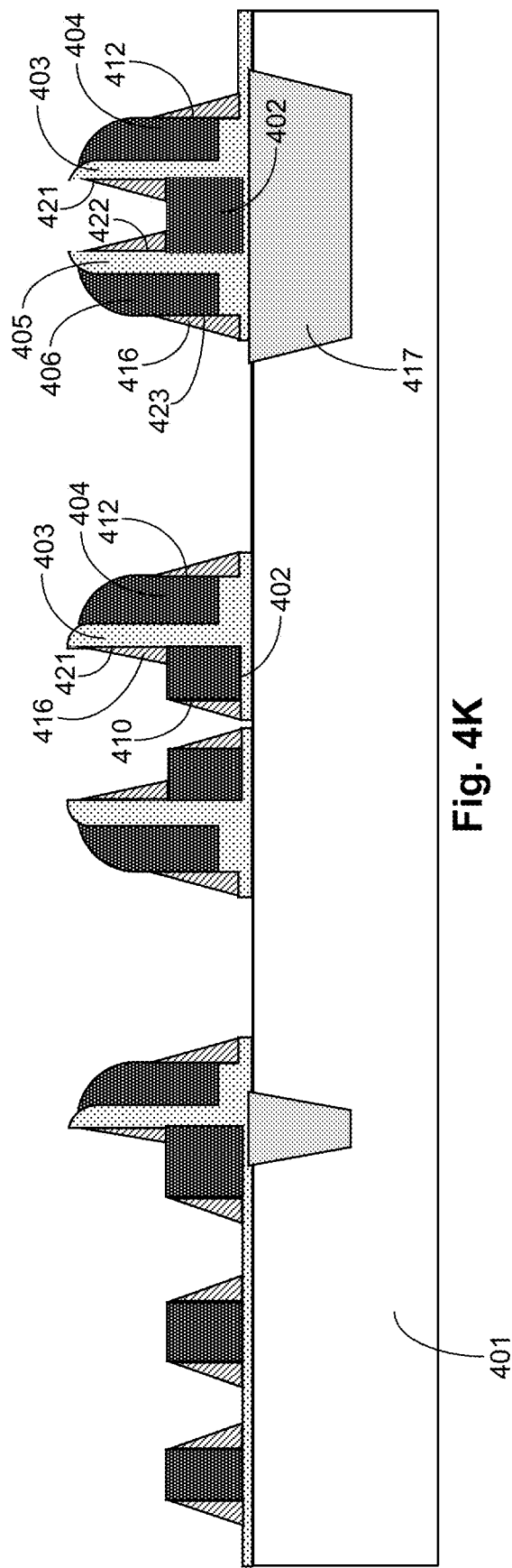
Figure 4M:
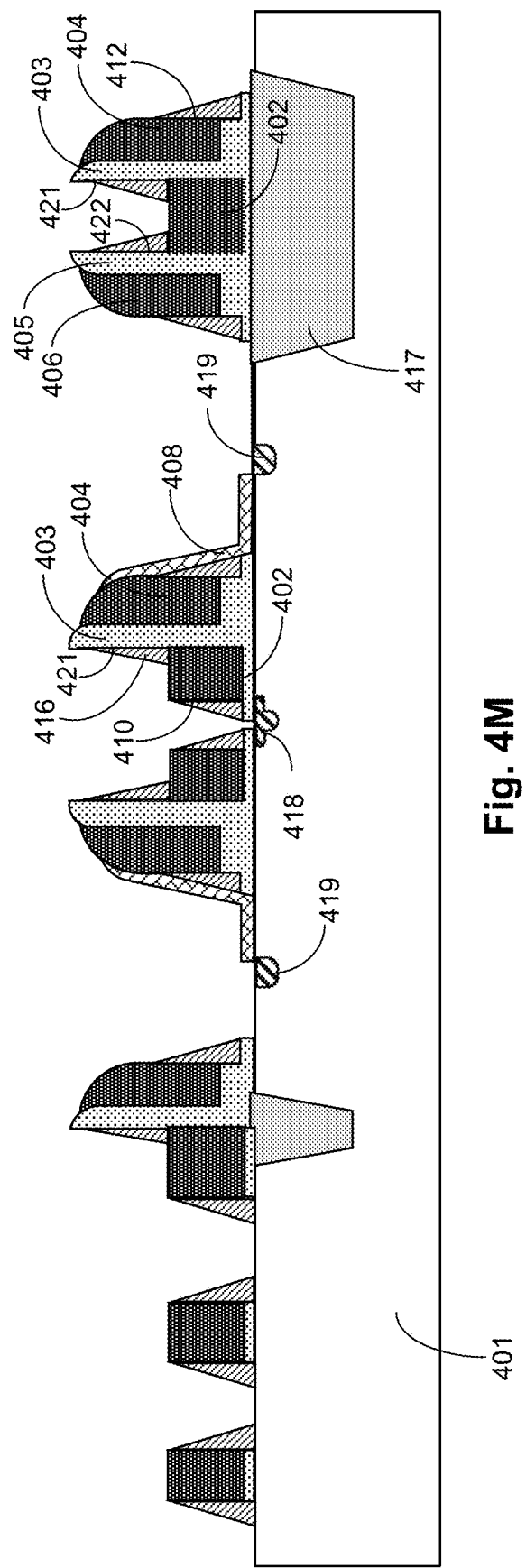
Figure 4N:
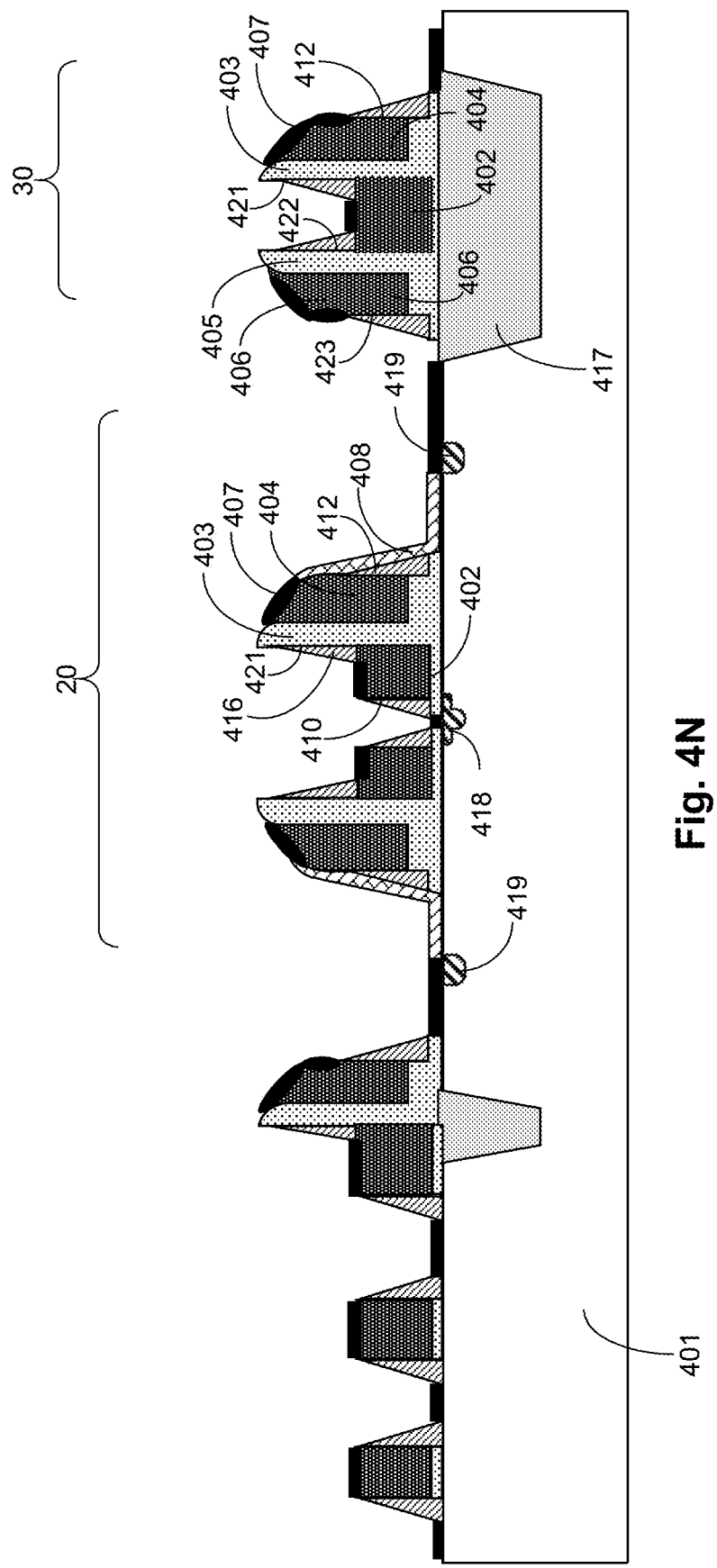

FIG. 4A to FIG. 4N show cross-section views of a manufacturing method for a high voltage device and a capacitor device having PIP structure according to embodiments of the present invention. First, as shown in FIG. 4A, an insulation layer which is for example but not limited to a shallow trench isolation (STI) structure 417 is formed on a substrate 401. Next, as shown in FIG. 4B, a first polysilicon layer 402' is formed on the substrate 401 by, for example but not limited to, a deposition process step. Next, as shown in FIG. 4B, a sacrificial layer 414' is formed on the first polysilicon layer 402' by, for example but not limited to, a deposition process step. Next, as shown in FIG. 4B, a height determining layer 415' is formed on the sacrificial layer 414' by, for example but not limited to, a deposition process step.

Next, as shown in FIG. 4C and FIG. 4D, a first stack region is formed with a mask 420 etching the first polysilicon layer 402', the sacrificial layer 414' and the height determining layer 415' by a first patterning process step, wherein the first stack region includes a first polysilicon region 402, a sacrificial region 414 and a height determining region 415. Next, as shown in FIG. 4E, a first insulation layer 403' is formed to cover outside the first stack region by, for example but not limited to, a deposition process step. Next, as shown in FIG. 4E, a second polysilicon layer 404' is formed to cover outside the first insulation layer 403' by, for example but not limited to, a deposition process step. Next, as shown in FIGS. 4F, 4G and 4H, a second polysilicon region 404 is formed outside the first insulation layer 403' (i.e. a third side 411) and a third polysilicon region 406 is formed outside a fifth side 413 of the first insulation layer 403', by a first self-aligned process step, such that the first polysilicon region 402, a second insulation region 405 and the third polysilicon region 406 are adjoined in sequence in a reverse direction of the horizontal direction.

Next, as shown in FIG. 4H, a first insulation region 403 is formed outside a first side 409 of the first polysilicon region 402 and the second insulation region 405 is formed outside a second side 410 of the first polysilicon region 402, by a second self-aligned process step, such that the second insulation region 405 adjoined to the first polysilicon region 402 in the horizontal direction. Next, as shown in FIG. 4I, a PIP structure is formed, for example, by a wet etching process step. Next, as shown in FIG. 4J, a dual gate structure is formed with a mask (not shown in FIG.) etching the sacrificial region 414 of the PIP structure of the high voltage device 20 and the first polysilicon region 402 by a second patterning process step. Next, as shown in FIG. 4K, a spacer layer 416 is formed on a sixth side 421 of the first insulation region 403, on the fourth side 412 of the second polysilicon region 404, on the second side 410 of the first polysilicon region 402, on a seventh side 422 of the second insulation region 405 and on an eighth side 423 of the third polysilicon region 406.

Next, as shown in FIG. 4L, a source 418 is formed in the substrate 401 below and outside the second side 410 of the first polysilicon region 402, wherein the first side 409 and the second side 410 are opposite sides of the first polysilicon region 402. As shown in FIG. 4L, a drain 419 is formed in the substrate 401 below and outside the fourth side 412 of the second polysilicon region 404, wherein the fourth side 412 is an opposite side of the second polysilicon region 404 which is opposite to a side of the second polysilicon region 404 that is adjoined to the third side 411 of the first insulation region 403. Each of the source 418 and the drain 419 can be formed by steps including, for example but not limited to, a lithography process step which forms a photo-resist layer as a mask and an ion implantation process step which implants N type or P type impurities (depending on which type the high voltage device 20 is) in the substrate 401 in the form of accelerated ions, to form the source 418 and the drain 419. The first polysilicon region 402 is configured to form a gate of the high voltage device 20 to control ON and OFF states of the high voltage device 20, and the second polysilicon region 404 is configured to form a split gate of the high voltage device 20 to adjust an electric field of a drift region during an operation of the high voltage device 20. The first polysilicon region 402, the first insulation region 403 and the second polysilicon region 404 of the dual gate structure are adjoined in sequence in the horizontal direction.

In one embodiment, the height of the second polysilicon region 404 and/or the height of the third polysilicon region 406 is 1.5 times to 2 times of a height of the first polysilicon region 402. In one embodiment, the first insulation layer 403' is formed by a high temperature oxidation (HTO) process step or a rapid thermal oxidation (RTO) process step. In one embodiment, the first insulation layer 403' is formed by a material including tetraethoxysilane (TEOS). In one embodiment, the thickness of the first insulation region 403 and/or the thickness of the second insulation region 405 in the horizontal direction is between 400 Å and 900 Å.

Next, as shown in FIG. 4M, a third insulation region 408 is formed outside the second polysilicon region 404 by a third self-aligned process step. The third insulation region 408 is configured to define a drain-extended region of the high voltage device 20. In one embodiment, a length of the drain-extended region in the horizontal direction is between 200 Å and 300 Å. Next, as shown in FIG. 4N, a metal silicide region 407 is formed outside the fourth side 412 of the second polysilicon region 404 and outside the eighth side 423 of the third polysilicon region 406; the metal silicide region 407 is configured to serve as electrical contacts of the second polysilicon region 404 and the third polysilicon region 406. The split gate (e.g. the second polysilicon region 404) of the high voltage device 20 is electrically connected to the gate (e.g. the first polysilicon region 402) or a ground. As shown in FIG. 4N, the first polysilicon region 402 is configured to form a first electrode of the capacitor device 30, and the first insulation region 403 is configured to form a dielectric layer of the capacitor device 30, and the second polysilicon region 404 is configured to form a second electrode of the capacitor device 30.

As described above, the present invention has advantages that: by forming a high voltage device with a capacitor device having PIP structure, the split gate does not deform or drift by the stack of multiple layers of the insulation region or the spacer layer, and the distance between the gate and the split gate is only related to the thickness of the first insulation region in the horizontal direction.

The present invention has been described in considerable detail with reference to certain preferred embodiments thereof. It should be understood that the description is for illustrative purpose, not for limiting the broadest scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a lightly doped drain region, may be added. For another example, the lithogrpahy process step is not limited to the mask technology but it can also include electron beam lithography, immersion lithogrpahy, etc. Therefore, in the same spirit of the present invention, those skilled in the art can think of various equivalent variations and various combinations, and there are many combinations thereof, and the description will not be repeated here. The scope of the present invention should include what are defined in the claims and the equivalents.

What is claimed is:

1. A manufacturing method of a high voltage device having PIP structure, comprising:
    forming a first polysilicon layer on a substrate;
    forming a sacrificial layer on the first polysilicon layer;
    forming a height determining layer on the sacrificial layer;
    etching the first polysilicon layer, the sacrificial layer and the height determining layer by a first patterning process step to form a first stack region, wherein the first stack region includes a first polysilicon region, a sacrificial region and a height determining region;
    forming a first insulation layer covering the first stack region;
    forming a second polysilicon layer covering the first insulation layer;
    forming a second polysilicon region outside the first insulation layer by a first self-aligned process step;
    forming a first insulation region outside a first side of the first polysilicon region by a second self-aligned process step;
    removing the height determining region to form a PIP structure;
    etching the sacrificial region and the first polysilicon region of the PIP structure by a second patterning process step, to form a dual gate structure;
    forming a source in the substrate below and outside a second side of the first polysilicon region, wherein the first side and the second side are opposite sides of the first polysilicon region; and
    forming a drain in the substrate below and outside a fourth side of the second polysilicon region, wherein the fourth side is an opposite side of the second polysilicon region which is opposite to a side of the second polysilicon region that is adjoined to the third side of the first insulation region;
    wherein the first polysilicon region is configured to form a gate of the high voltage device to control ON and OFF states of the high voltage device;
    wherein the second polysilicon region is configured to form a split gate of the high voltage device to adjust an electric field of a drift region during an operation of the high voltage device;
    wherein the first polysilicon region, the first insulation region and the second polysilicon region of the dual gate structure are adjoined in sequence in a horizontal direction.

2. The manufacturing method of the high voltage device having PIP structure of claim 1, wherein a height of the second polysilicon region is 1.5 times to 2 times of a height of the first polysilicon region.

3. The manufacturing method of the high voltage device having PIP structure of claim 1, wherein the first insulation layer is formed by a high temperature oxidation (HTO) process step or a rapid thermal oxidation (RTO) process step.

4. The manufacturing method of the high voltage device having PIP structure of claim 1, wherein the first insulation region includes tetraethoxysilane (TEOS).

5. The manufacturing method of the high voltage device having PIP structure of claim 1, wherein a thickness of the first insulation region in the horizontal direction is between 400 Å and 900 Å.

6. The manufacturing method of the high voltage device having PIP structure of claim 1, further comprising:
    forming a metal silicide region outside the fourth side of the second polysilicon region, the metal silicide region being configured to serve as an electrical contact of the second polysilicon region; and
    forming a third insulation region outside the second polysilicon region by a third self-aligned process step;
    wherein the third insulation region is configured to define a drain-extended region of the high voltage device, wherein a length of the drain-extended region in the horizontal direction is between 200 Å and 300 Å.

7. The manufacturing method of the high voltage device having PIP structure of claim 1, wherein the split gate is electrically connected to the gate or a ground.

8. A manufacturing method of a capacitor device having PIP structure, comprising:
    forming a first polysilicon layer on a substrate;
    forming a sacrificial layer on the first polysilicon layer;
    forming a height determining layer on the sacrificial layer;
    etching the first polysilicon layer, the sacrificial layer and the height determining layer by a first patterning process step to form a first stack region, wherein the first stack region includes a first polysilicon region, a sacrificial region and a height determining region;
    forming a first insulation layer covering the first stack region;
    forming a second polysilicon layer covering the first insulation layer;
    forming a second polysilicon region outside the first insulation layer by a first self-aligned process step;
    forming a first insulation region outside a first side of the first polysilicon region by a second self-aligned process step; and
    removing the height determining region to form a PIP structure;
    wherein the first polysilicon region is configured to form a first electrode of the capacitor device, and the first insulation region is configured to form a dielectric layer of the capacitor device, and the second polysilicon region is configured to form a second electrode of the capacitor device.

9. The manufacturing method of the capacitor device of claim 8, further comprising:
    forming a second insulation region outside a second side of the first polysilicon region and adjoined to the first polysilicon region in a horizontal direction; and
    forming a third polysilicon region outside a fifth side of the second insulation region, such that the first polysilicon region, the second insulation region and the third polysilicon region are adjoined in sequence in a reverse direction of the horizontal direction;
    wherein the third polysilicon region is formed outside the fifth side of the second insulation region by the first self-aligned process step;
    wherein the second insulation region is formed outside the second side of the first polysilicon region by the second self-aligned process step.

10. The manufacturing method of the capacitor device of claim 8, wherein a height of the second electrode is 1.5 times to 2 times of a height of the first electrode.

11. The manufacturing method of the capacitor device of claim 8, wherein the first insulation region is formed by a high temperature oxidation (HTO) process step or a rapid thermal oxidation (RTO) process step.

12. The manufacturing method of the capacitor device of claim 8, wherein the first insulation region includes tetraethoxysilane (TEOS).

13. The manufacturing method of the capacitor device of claim 8, wherein a thickness of the first insulation region in the horizontal direction is between 400 Å and 900 Å.

\* \* \* \* \*